United States Patent [19]
Akaogi

[11] Patent Number: 5,521,866
[45] Date of Patent: May 28, 1996

[54] NON-VOLATILE SEMICONDUCTOR MEMORY DEVICE HAVING FLOATING GATE

[75] Inventor: Takao Akaogi, Kawasaki, Japan

[73] Assignee: Fujitsu Limited, Kawasaki, Japan

[21] Appl. No.: 244,634

[22] PCT Filed: Oct. 6, 1993

[86] PCT No.: PCT/JP93/01438

§ 371 Date: Sep. 2, 1994

§ 102(e) Date: Sep. 2, 1994

[87] PCT Pub. No.: WO94/08340

PCT Pub. Date: Apr. 14, 1994

[30] Foreign Application Priority Data

Oct. 6, 1992 [JP] Japan ..................... 4-267412

[51] Int. Cl.⁶ .................................. G11C 16/06
[52] U.S. Cl. .................. 365/185.29; 365/185.25
[58] Field of Search ........................... 365/185, 218, 365/900, 204, 189.11, 230.06, 194, 185.25, 185.29

[56] References Cited

U.S. PATENT DOCUMENTS

| | | | |
|---|---|---|---|
| 4,959,812 | 9/1990 | Momodomi et al. | 365/185 |
| 5,265,059 | 11/1993 | Wells et al. | 365/204 |
| 5,388,078 | 2/1995 | Arakawa | 365/204 X |

FOREIGN PATENT DOCUMENTS

| | | |
|---|---|---|
| 62-006494 | 1/1987 | Japan. |
| 1-320700 | 12/1989 | Japan. |
| 2-166698 | 6/1990 | Japan. |
| 3-295097 | 12/1991 | Japan. |

*Primary Examiner*—Joseph A. Popek
*Attorney, Agent, or Firm*—Staas & Halsey

[57] ABSTRACT

A non-volatile semiconductor memory device includes a semiconductor substrate with a first conductivity type, a first well of a second conductivity type formed on the semiconductor substrate, a second well of the first conductivity type formed on the first well, a plurality of memory cells provided in the second well and each including a tunneling insulation film having a thickness allowing a tunneling of carriers, a floating gate electrode provided on the tunneling insulation film, an interlayer insulation film provided on the floating gate electrode, a control electrode provided on the interlayer insulation film, and a pair of diffusion regions of the first conductivity type formed on the second well at both sides of a channel region. An erasing circuit is provided for dissipating electric charges held in the floating gate electrode into the channel region through the tunneling insulation film in the form of a tunneling current, wherein the erasing circuit applies, in response to a start signal indicative of commencement of erasing, a first erase signal to the first well and a second erase signal having a polarity identical to the first erase signal to the second well, such that the first erase signal is applied in advance to the second erase signal.

14 Claims, 15 Drawing Sheets

|  | Vg | Vd | Vs | Vsub |
|---|---|---|---|---|
| ERASE | $V_{MM}$ | OPEN | OPEN | Vcc |
| WRITE | $V_{PP}$ | Vcc | 0v | 0v |
| READ | Vcc | ~1v | 0v | 0v |

$V_{PP}$ : LARGE POSITIVE VOLTAGE
$V_{MM}$ : LARGE NEGATIVE VOLTAGE

|  | $V_g$ | $V_d$ | $V_s$ | $V_{sub}$ |
|---|---|---|---|---|
| ERASE | $V_{MM}$ | OPEN | $V_{CC}$ | 0v |
| WRITE | $V_{PP}$ | $V_{CC}$ | 0v | 0v |
| READ | $V_{CC}$ ~ 1v | 0v | 0v |  |

$V_{PP}$ : LARGE POSITIVE VOLTAGE
$V_{MM}$ : LARGE NEGATIVE VOLTAGE

FIG.7
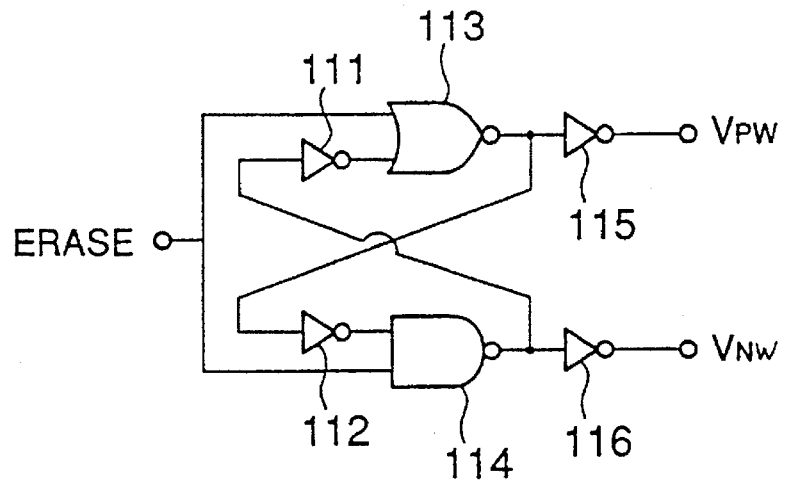
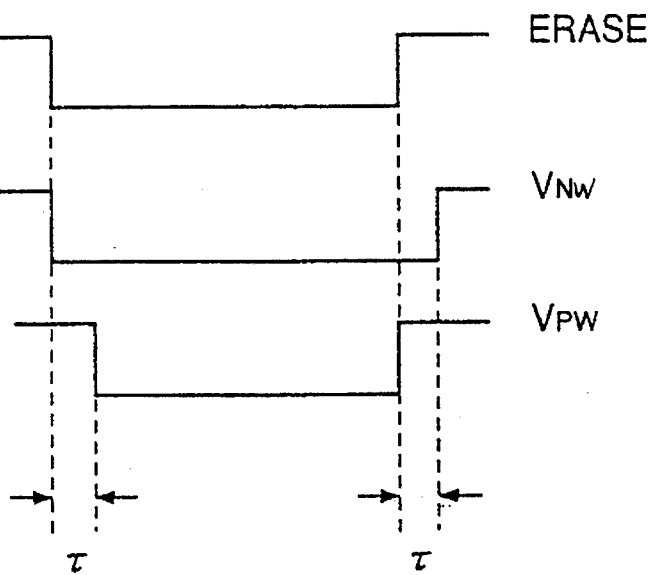

|    | $V_1$ | $V_2$ | $V_3$ | $V_4$ |
|----|-------|-------|-------|-------|
| ER | Vcc   | ——    | ——    | Vcc   |
| WR | ++    | 0v    | ++    | 0v    |
| RD | Vcc   | 0v    | Vcc   | 0v    |

NON-VOLATILE SEMICONDUCTOR MEMORY DEVICE HAVING FLOATING GATE

BACKGROUND OF THE INVENTION

1. Field of the Invention

The present invention generally relates to electrically erasable non-volatile semiconductor memory devices (EEPROMs), and more particularly to a so-called flash memory that stores information in the form of electric charges accumulated in a floating gate.

2. Description of the Related Art

Recently, intensive efforts are being made on research and development of so-called flash memories. Flash memories, having a compact and solid construction, are expected to replace bulky and fragile conventional hard disk devices in various computers, including laptops. As each memory cell in the flash memory is formed of a single transistor similar to the memory cell transistor of conventional dynamic random access memories, flash memories can easily realize high integration density and large storage capacity. Further, flash memories have no movable parts such as driving motors, and consume little electric power.

In flash memories, each memory cell has a construction similar to a MOS transistor and includes a source region and a drain region formed in a semiconductor substrate. Further, there is provided a floating gate between the substrate and a control electrode such that the floating gate is insulated by a thin tunneling insulation film, wherein the control electrode corresponds to the gate electrode of conventional MOS transistors. When storing information, a predetermined control voltage is applied to the gate electrode. Thus, carriers flowing from the source region to the drain region are accelerated in the vicinity of the drain region and are injected into the floating gate through the aforementioned tunneling insulation film. The carriers, and hence the electric charges thus injected to the floating gate, are held therein stably and urge the potential level of the floating gate to a predetermined level. As a result, the flow of carriers from the source to the drain is controlled to on and off states by the carriers stored in the floating gate. In other words, it is possible to read the electric charges, and hence the information stored in the floating gate, by detecting the drain current of the memory cell transistor. When erasing information thus stored, a potential is applied to the control electrode such that the electric charges in the floating gate are expelled, simultaneously, to a potential that is applied to the semiconductor substrate or to the source region in the substrate for extracting the electric charges from the floating gate. As a result, the electric charges in the floating gate are dissipated, through the aforementioned tunneling insulation film, either to the semiconductor substrate or to the source region in the substrate.

FIG. 1 schematically shows the construction of the memory cell in the conventional flash memory described above.

Referring to FIG. 1, the memory cells are formed on a semiconductor substrate 10, which may be doped to the p-type for example, in an arrangement of rows and columns, wherein each of the memory cells includes an $n^+$-type source region 11a and an $n^+$-type drain region 11b on the substrate 10, spaced such that the regions 11a and 11b are separated from each other by a p-type channel region 10a interposed therebetween. The part of the semiconductor substrate 10 corresponding to the channel region 10a is covered by a tunneling insulation film 12a, and a floating gate electrode 12 is provided on the tunneling insulation film 12a. Further, the gate electrode 12 is covered by an interlayer insulation film 13a, and a control electrode 13 is provided on the interlayer insulation film 13a.

When storing information, a negative source voltage Vs is applied to the source region 11a, and a positive drain voltage Vd is applied to the drain region 11b, such that electrons flow from the source region 11a to the drain region 11b through the channel region 10a. Further, a positive control voltage Vg is applied to the control electrode 13. Thereby, the electrons flowing from the source region 11a to the drain region 11b are accelerated in the channel region 10a and acquire a large kinetic energy in the vicinity of the drain electrode 11b. The electrons accelerated are injected into the floating gate 12 after transit through the tunneling insulation film in the form of Fowler-Nordheim tunneling current that is caused to flow as a result of the positive voltage of the control electrode 13. The electrons thus injected into the floating gate 12 are held stably therein with little leakage, even when the power is shut off. When negative electric charges are thus accumulated in the floating gate 12, the MOS transistor, formed between the source region 11a and the drain region 11b, no longer turns on due to the negative charges of the floating gate 12, even when a control voltage Vg is applied to the control electrode 13 so as to cause a turning-on of the MOS transistor. Thus, by detecting the drain voltage Vd, it becomes possible to read the information stored in the memory cell.

When updating or erasing information stored in a memory cell, the control voltage Vg applied to the control electrode 13 is set to a large negative voltage. Simultaneously, a positive voltage is applied to the substrate 10 as a substrate voltage. Alternatively, a positive voltage is applied to the source region 11a as the source voltage Vs. As a result, the electrons accumulated in the floating gate 12 are expelled, respectively and alternatively, either to the substrate 10 or to the source region 11a provided in the substrate 10. As a result, the information stored in the memory cell is erased.

FIG. 2(A) shows the operation of a flash memory cell of the so-called channel erase type wherein the electrons in the floating gate 12 are dissipated to the substrate 10 when erasing information. Further, FIG. 2(B) shows the setting of the source voltage Vs, the drain voltage Vd, the control voltage Vg and the substrate voltage $V_{SUB}$ for each of the writing, reading and erasing modes for the memory cell of FIG. 2(A). In the drawing, the tunneling insulation film 12a and the interlayer insulation film 13a are omitted for the sake of simplicity.

Referring to FIG. 2(B), a large negative voltage $V_{MM}$ is applied to the control electrode 13 in the erase mode. Simultaneously, a positive supply voltage Vcc is applied to the substrate 10. As a result, the electrons in the floating gate 12 are dissipated to the substrate 10 along a path (1) shown schematically in FIG. 2(A). In this process, the source region Vs and the drain region Vd assume an opened or floating state. When in the write mode, on the other hand, the control voltage Vg applied to the control electrode 13 is set to a large positive voltage $V_{PP}$. Simultaneously, the source region 11b is grounded (Vs=0 V) and the positive supply voltage Vcc is applied to the drain region 11b. As a result, the electrons are caused to flow from the source region 11a to the drain region 11b, and accelerated electrons are injected to the floating gate 12 in the form of tunneling current, after passing through a path (2) schematically shown in FIG. 2(A). In the read mode, on the other hand, the supply voltage Vcc is applied to the control electrode 13 via a selected word line, and the drain voltage Vd is set to a positive voltage of about 1 V. Further, the source region 11a and the substrate 10 are grounded (Vs=0 V). As a result, the electrons flow from the source region 11a to the drain region 11b in the case where there is no electron accumulation in the floating gate 12 and the transistor of FIG. 2(A) is turned on. When the electrons are accumulated in the floating gate 12, on the other hand, the flow of electrons through the channel region 10a does not occur due to the electric charges of the electrons. In other words, the transistor of FIG. 2(A) does not turn on. Thus, by detecting the change of the drain voltage Vd, caused as a result of the turning-on and turning-off of the foregoing transistor by means of a sense amplifier, it becomes possible to read the information stored in the floating gate 12.

FIGS. 3(A) and 3(B) show the construction and operation of a flash memory cell that causes a dissipation of the electric charges of the floating gate 12 to the source region 11a, and not to the substrate 10, when erasing information. Similarly to FIG. 2(A), the tunneling insulation film 12 and the interlayer insulation film 13a are omitted in FIG. 3(A). Since the write mode operation and the read mode operation of the memory cell of FIGS. 3(A) and 3(B) are identical with those of the memory cell of FIGS. 2(A) and 2(B), only the erase mode operation will be described below.

Referring to FIG. 3(B), the source voltage Vs applied to the source region 11a is set to the positive supply voltage Vcc in the erase mode. Further, the control voltage Vg applied to the control electrode 13 is set to the negative high voltage $V_{MM}$. On the other hand, the substrate voltage $V_{SUB}$ is set to 0 V. Further, the drain region 11b is set to an opened state. As a result, the electrons in the floating gate 12 are dissipated to the source region 11a along the path (1) shown schematically in FIG. 3(A).

In both the device of FIGS. 2(A) and 2(B) and the device of FIGS. 3(A) and 3(B), unwanted erase of memory cells is avoided by applying the positive supply voltage Vcc to the memory cell not to be erased, as the control voltage Vg.

FIG. 4 shows an example of a flash memory that uses the memory cell of FIG. 2(A). Referring to FIG. 4, the flash memory includes an n-type well 10A formed in the p-type substrate 10, wherein another, p-type well 10B is formed within the n-type well 10A. In the p-type well 10B, n$^+$-type diffusion regions are formed in correspondence to the source region 11a and the drain region 11b of FIG. 2(A), and a number of floating electrodes 12 as well as control electrodes 13 are arranged in rows and columns. By forming a plurality of memory cells in the well 10B and applying an erase voltage $V_{PW}$ to the well 10B, it becomes possible to achieve simultaneous erase of information in each of the cells. As such a double well structure, which includes the n-type well 10A and the p-type well 10B, forms a parasitic pnp transistor when constructed on a p-type substrate such as the substrate 10 of FIG. 4, it is necessary to apply a voltage $V_{NW}$ to the n-type well 10A when applying the erase voltage $V_{PW}$ to the well 10B, in order to avoid the conduction of the transistor.

FIG. 5 shows the circuit construction of the flash memory shown in FIG. 4.

Referring to FIG. 5, memory cells C, each having the construction of FIG. 2(A), are disposed in rows and columns on the well 10B which in turn is formed on the semiconductor substrate 10 as shown in FIG. 4; those memory cells C aligned in the row direction have respective control electrodes 13 connected commonly with each other by a word line WL as shown in FIG. 5. On the other hand, those memory cells aligned in the column direction have respective drain regions 11b connected commonly with each other by a bit line BL. The word line WL is selected, via an address buffer 23 and a row decoder 24, in response to the row address data supplied to the flash memory device, and the control voltage Vg shown in FIG. 2(B) is applied to the selected word line WL. Particularly, the row decoder 24 supplies, in the erase mode, the negative erase voltage $V_{MM}$ shown in FIG. 2(B) exclusively to the selected word line WL, based upon the supply voltage supplied from a decoder power supply circuit 25. The row decoder 24 further supplies the normal, positive supply voltage Vcc to the unselected word line WL in order to avoid unwanted erase. As a result, only those memory cells C that are connected to the selected word line (i.e., a memory cell block) are erased simultaneously. In other words, the memory cells of the selected memory cell block are erased simultaneously.

In the construction of FIG. 5, it will be noted that each bit line BL is provided with a corresponding column selection transistor T, wherein the column selection transistor T is selectively turned on and turned off via a column address buffer 21 and a column decoder 22, based upon column address data supplied to the column decoder 22. Each bit line BL is connected to a common data line DL via a corresponding column selection transistor T, and an ordinary sense amplifier 27 connected to the line DL discriminates the logic value of the information read out from the selected memory cell C that has been selected in response to the supplied address data. The output of the sense amplifier 27 is supplied via an input/output buffer 28 to an output terminal. Further, there is provided a write amplifier 26 in connection to the line DL for supplying an information signal, which has been supplied via the input/output buffer 28, to a selected bit line BL via the switch transistor T. Further, the circuit of FIG. 5 includes an erase power supply circuit 29 for applying the erase voltages $V_{NW}$ and $V_{PW}$ to the wells 10A and 10B of FIG. 4 in the erase mode, in addition to the foregoing circuits.

FIG. 6 shows a block diagram of a flash memory that uses the memory cell of FIGS. 3(A) and 3(B). As the flash memory of FIG. 6 has a construction generally identical to the device of FIG. 5, those parts of FIG. 6 corresponding to FIG. 5 are designated by the same reference numerals and the description thereof will be omitted.

In the flash memory having a construction of FIG. 6, the source regions of each memory cell transistor C are connected commonly to an erase power supply circuit 29', while the erase power supply circuit 29' produces a source voltage Vs as indicated in FIG. 3(B). In correspondence to this, the decoder circuit 25 supplies the erase voltage $V_{MM}$ to the selected word line WL and the positive supply voltage Vcc to the unselected word line WL.

Flash memories of the type that erase information by causing a dissipation of electric charges to the substrate have the problem of the wells 10A and 10B forming a parasitic bipolar transistor with the substrate 10, as already explained. Thus, in order to avoid turning-on of the parasitic bipolar transistor, it is necessary to apply a suitable biasing to the substrate 10 as well as to the wells 10A and 10B. Conventionally, the bias voltage $V_{NW}$ applied to the well 10A and the bias voltage $V_{PW}$ applied to the well 10B, have been set equal to the positive supply voltage Vcc. On the other hand, the existence of parasitic resistances 10A and 10B in the p-type well 10A and in the n-type well 10B raises a problem that there may occur a transient state wherein the parasitic bipolar transistor turns on. When such a turning-on of the parasitic bipolar transistor occurs, the operation of the flash memory becomes unstable.

It should be noted that the construction to apply the so-called anti-disturb voltage, with the magnitude of about Vcc, to unselected word lines to avoid unwanted erasing of information in unselected memory cell blocks, is employed not only in the flash memories of the type which cause the dissipation of electric charges to the substrate in the erase mode but also in the flash memories of the type in which the electric charges are dissipated to the source region. On the other hand, such a construction has a problem that there may occur a transient state wherein the anti-disturb voltage is not effectively applied. In such a case, there is a risk which the information that should be retained is unwantedly erased from the memory cell.

Further, the flash memories of the type shown in FIG. 4, that dissipate electric charges in the floating gate 12 to the well 10B in the erase mode, tend to have a problem that the p-n junction, formed between the well 10B and the n-type diffusion region 11a that forms the drain region or source region, is subjected to a forward biasing in the erase mode. When this occurs, the bit line BL as well as the source region are charged to the level of the supply voltage Vcc. Further, in the flash memories having the construction to dissipate electric charges in the floating gate to the source region 11a in the erase mode as shown in FIG. 3(A), there arises a problem in that the drain region 11b assumes an opened state in the erase mode. Further, the anti-disturb voltage is applied to the unselected word lines in this state. Thus, while it is possible to dissipate the positive electric charges of the Vcc level on the bit line BL by turning the memory cell transistor on, there occurs a problem in that the electrons are accelerated in the channel region 11a during the dissipation process, as they travel from the source region 11a to the drain region 11b (see FIG. 3A), and are injected into the floating gate 12 in the form of a tunneling current. In other words, there may occur an unwanted writing of information into the floating gate while conducting a discharging of the bit line BL in the construction of FIG. 3(A).

DISCLOSURE OF THE INVENTION

Accordingly, it is an object of the present invention to provide a novel and useful non-volatile semiconductor memory device wherein the foregoing problems are eliminated.

Another object of the present invention is to provide a non-volatile semiconductor memory device having a floating gate for storing information in the floating gate in the form of electric charges, wherein a stable operation is guaranteed even in the transient state.

Another object of the present invention is to provide a non-volatile semiconductor memory device, comprising: a semiconductor substrate having a first conductivity type; a first well of a second, opposite conductivity type formed on a surface of said semiconductor substrate such that said first well is included in said semiconductor substrate; a second well of said first conductivity type formed on a surface of said first well such that said second well is included in said first well; a plurality of memory cells provided in said second well, each of said memory cells comprising a tunneling insulation film provided on a surface of said second well in correspondence to a channel region and having a thickness allowing a tunneling of carriers therethrough, a floating gate electrode provided on said tunneling insulation film so as to be insulated electrically from surroundings, an interlayer insulation film provided on said floating gate electrode, a control electrode provided on said interlayer insulation film, and a pair of diffusion regions of said first conductivity type formed on said second well at both sides of said channel region; selection means supplied with an address signal for selecting a memory cell from said plurality of memory cells in response thereto; writing means for writing information into said selected memory cell by injecting electric charges from said channel region to said floating gate electrode through said tunneling insulation film in the form of a tunneling current; reading means for reading information from said selected memory cell by detecting a current flowing through said channel region; and erasing means for erasing information stored in said selected memory cell by dissipating electric charges held in said floating gate electrode into said channel region in said second well through said tunneling insulation film in the form of a tunneling current;

characterized in that said erasing means applies, in response to a start signal indicative of commencement of erasing, a first erase signal to said first well and a second erase signal having a polarity identical to said first erase signal to said second well, such that said first erase signal is applied in advance to said second erase signal.

According to the present invention, it is ensured to apply a reverse biasing to the p-n junctions formed between the substrate and the first well and between the first well and the second well, by applying the erase voltage first to the first well. As a result, the problem of unstable operation of the flash memory, caused by the transient turning-on of the bipolar transistor formed on the substrate by the first and second wells, is successfully eliminated.

Another object of the present invention is to provide a non-volatile semiconductor memory device, comprising: a semiconductor substrate; a plurality of memory cells formed on said semiconductor substrate, each of said plurality of memory cells comprising a tunneling insulation film provided in correspondence to a channel region and having a thickness for allowing a tunneling of carriers, a floating gate electrode provided on said tunneling insulation film so as to be insulated electrically from surroundings, an interlayer insulation film provided on said floating gate electrode, a control electrode provided on said interlayer insulation film, a source region formed in said semiconductor substrate in a first side of said channel region, and a drain region formed in said semiconductor substrate in a second, opposite side of said channel region; selection means supplied with an address signal for selecting a memory cell from said plurality of memory cells in response thereto; writing means for writing information to said selected memory cell by injecting electric charges from said channel region to said floating gate electrode through said tunneling insulation film in the form of a tunneling current; reading means for reading information from said selected memory cell by detecting a current flowing through said channel region; and erasing means for erasing information stored in said memory cell in the form of a tunneling current flowing through said tunneling insulation film by applying an erase control voltage;

characterized in that said plurality of memory cells are arranged in rows and columns such that, in each of said columns, the memory cells included in the column have respective drain regions connected commonly by a bit line;

each of said bit lines is provided with a discharging circuit for discharging said bit line, said discharging circuit being activated in response to a trailing edge of said erase signal, after information stored in said memory cells are erased, said discharging circuit thereby causing a discharge of said bit lines.

According to the present invention, the electric charges accumulated on said bit lines are positively discharged after an erase mode. Thus, the problem of the electric charges being injected through the tunneling insulation film into the floating gate in the read mode to cause erroneous writing of information to the memory cell is successfully eliminated.

Another object of the present invention is to provide a non-volatile semiconductor memory device, comprising: a semiconductor substrate; a plurality of memory cells formed on said semiconductor substrate, each of said plurality of memory cells comprising a tunneling insulation film provided in correspondence to a channel region and having a thickness for allowing a tunneling of carriers, a floating gate electrode provided on said tunneling insulation film so as to be insulated electrically from surroundings, an interlayer insulation film provided on said floating gate electrode, a control electrode provided on said interlayer insulation film, a source region formed in said semiconductor substrate in a first side of said channel region, and a drain region formed in said semiconductor substrate in a second, opposite side of said channel region; selection means supplied with an address signal for selecting one of said plurality of memory cells in response thereto; writing means for writing information to said selected memory cell by injecting electric charges from said channel region to said floating gate electrode through said tunneling insulation film in the form of a tunneling current; reading means for reading information from said selected memory cell by detecting a current flowing through said channel region; and erasing means for erasing information stored in said memory cell in the form of a tunneling current flowing through said tunneling insulation film by applying an erase control voltage;

characterized in that said erase means applies said erase control voltage to one of said substrate and said source region of said memory cell, with a polarity and magnitude such that electric charges held in said floating gate as information are extracted, said erase means simultaneously applying an anti-disturb voltage to said control electrode of said memory cells except for said selected memory cell, for avoiding unnecessary erase of information;

wherein said erasing means comprises timing setting means for canceling said anti-disturb voltage upon end of erasing of information, such that said anti-disturb voltage is canceled after said erase control voltage is canceled.

According to the present invention, the anti-disturb voltage is not canceled before the erase control voltage is canceled, even in the transient state that is associated with the end of the erase mode. Thus, erroneous erase of information is positively eliminated.

Another object of the present invention is to provide a non-volatile semiconductor memory device, comprising: a semiconductor substrate; a plurality of memory cells formed on said semiconductor substrate, each of said plurality of memory cells comprising a tunneling insulation film provided in correspondence to a channel region and having a thickness for allowing a tunneling of carriers, a floating gate electrode provided on said tunneling insulation film so as to be insulated electrically from surroundings, an interlayer insulation film provided on said floating gate electrode, a control electrode provided on said interlayer insulation film, a source region formed in said semiconductor substrate in a first side of said channel region, and a drain region formed in said semiconductor substrate in a second, opposite side of said channel region; selection means supplied with an address signal for selecting a memory cell from said plurality of memory cells in response thereto; writing means for writing information to said selected memory cell by injecting electric charges from said channel region to said floating gate electrode through said tunneling insulation film in the form of a tunneling current; reading means for reading information from said selected memory cell by detecting a current flowing through said channel region; and erasing means for erasing information stored in said memory cell in the form of a tunneling current flowing through said tunneling insulation film by applying an erase control voltage;

characterized in that said erase means comprises internal boosting means for applying a control voltage to said control electrode of said selected memory cell with a magnitude such that the electric charges accumulated in said floating gate electrode are expelled, wherein said internal boosting means increases the magnitude of said control voltage gradually.

According to the present invention, the control voltage applied to the control electrode changes gradually, and it becomes possible to avoid the concentration of electric field to the tunneling insulation film. As a result, the number of times for updating information in the semiconductor memory device increases substantially.

Other objects and further features of the present invention will become apparent from the following description of preferred embodiment when read in conjunction with the attached drawings.

BRIEF DESCRIPTION OF THE DRAWINGS

FIG. 7 is a circuit diagram showing the construction of a timing circuit used in a flash memory according to a first embodiment of the present invention;

FIGS. 8(A)–8(C) are diagrams showing the operational timing of the circuit of FIG. 7;

SUMMARY OF THE INVENTION

Figure 1:
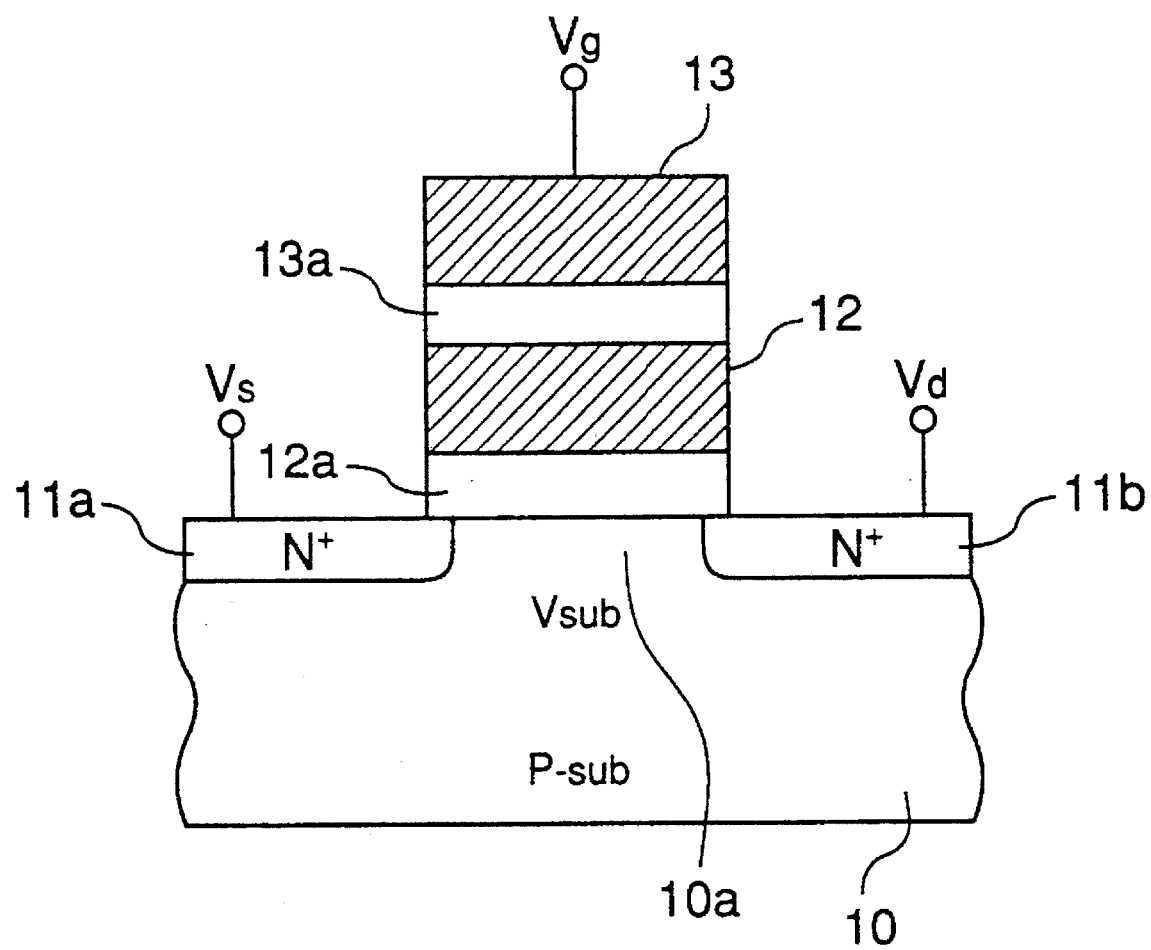
FIG. 1 is a diagram showing the fundamental construction of a conventional flash memory.

Hereinafter, a first embodiment of the present invention will be described.

The flash memory according to the first embodiment of the present invention is constructed on the substrate 10 shown in FIG. 4 and has a general circuit construction explained with reference to FIG. 5. In order to eliminate the transient instability of erase mode operation described in relation to the background art, the present invention uses a timing circuit of FIG. 7 for adjusting the timing of the erase voltages $V_{NW}$ and $V_{PW}$ produced by the erase power supply circuit 29 respectively for the wells 10A and 10B on the substrate 10.

Referring to FIG. 7, the timing circuit is formed of a flip-flop including a NOR gate 113 and a NAND gate 114, wherein the erase voltage signal ERASE produced by the erase power supply circuit 29 is supplied to respective first input terminals of the NOR gate 113 and the NAND gate 114. Further, the output signal of the NOR gate 113 is supplied on the one hand to an output terminal via an inverter 115 as an output signal $V_{PW}$ and on the other hand to a second input terminal of the NAND gate 114 via an inverter 112 that has a delay τ. On the other hand, the output signal of the NAND gate 114 is supplied on the one hand to an output terminal via an inverter 116 as an output signal $V_{NW}$ and on the other hand to a second input terminal of the NOR gate 113 via another inverter 111 that has a delay τ.

FIGS. 8(A)–8(C) show the timing of the input signal ERASE supplied to the timing circuit of FIG. 7 and the timing of the output signals $V_{NW}$ and $V_{PW}$.

Referring to FIGS. 8(A)–8(C), the output signal $V_{NW}$ changes from a level H (high) to a level L (low) upon transition of the logic value of the erase voltage signal ERASE, supplied from the erase power supply circuit 29, from a level H to a level L. Further, the change of the output signal $V_{NW}$ is transmitted to the NOR gate 113 after a delay τ caused by the inverter 111, and the output signal $V_{PW}$ of the gate 113 changes caused by the inverter 111, following a level H to a level L after a delay T from the foregoing transition of the input signal ERASE from the level H to the level L. As long as the level of the signal ERASE is L, the foregoing state is maintained.

When the erase voltage signal ERASE changes from the level L to the level H, the output signal $V_{PW}$ of the NOR gate 113 changes immediately from the level L to the level H. Further, the change of the output level of the NOR gate 113 is transmitted to the NAND gate 114 after a delay τ caused by the inverter 112, and the output signal of the NOR gate 113 changes from the level L to the level H after a delay τ following the transition of the signal ERASE from the level L to the level H.

Figure 4:
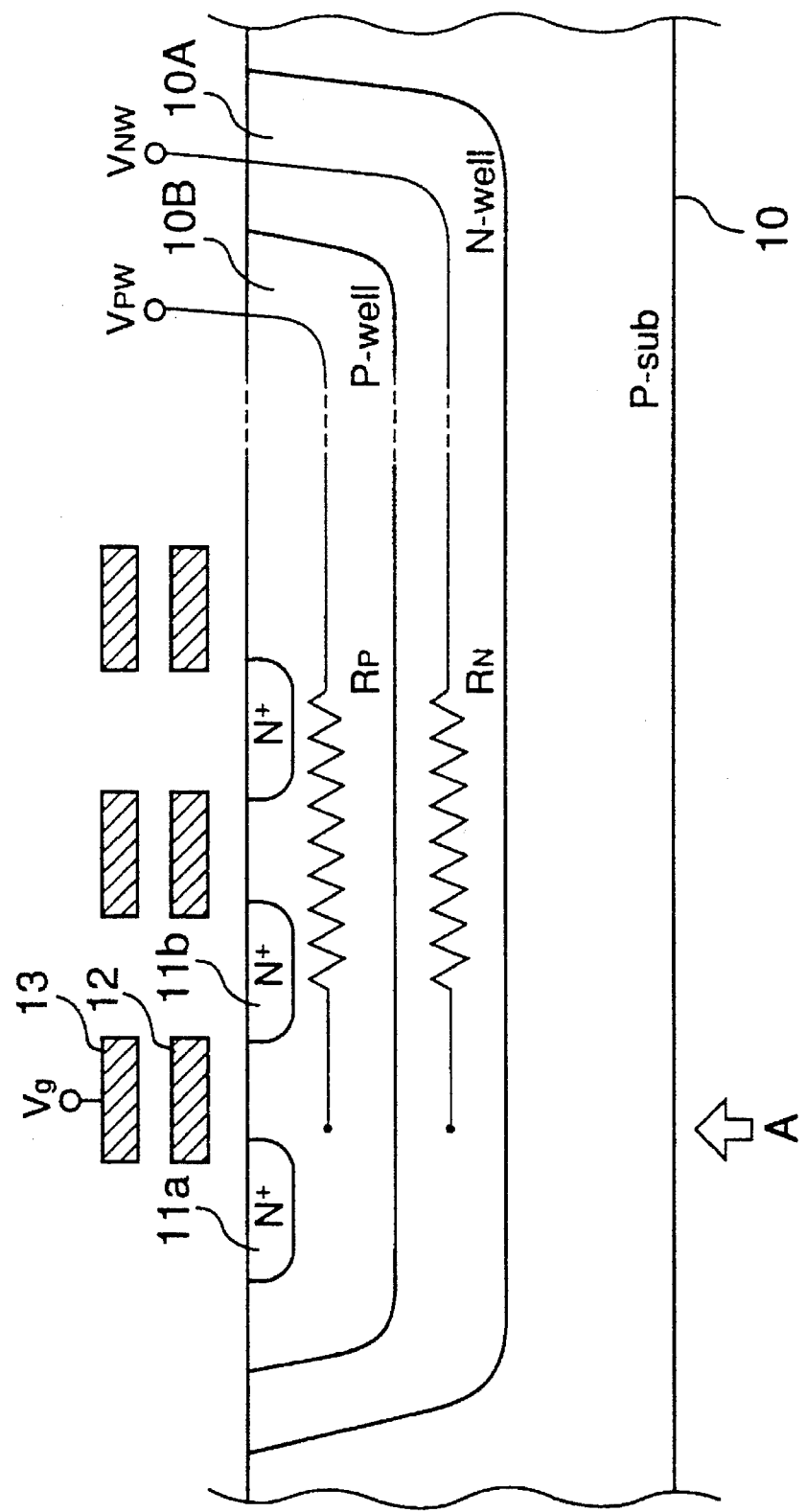
FIG. 4 is a diagram showing the construction of a substrate used in the flash memory of FIGS. 2(A) and 2(B)

In the circuit of FIG. 7, the output signal $V_{PW}$ of the NOR gate 113 is applied to the p-type well 10B of FIG. 4. On the other hand, the output signal $V_{NW}$ of the NAND gate 114 is applied to the n-type well 10A of FIG. 4. By setting the timing of applying the signals $V_{PW}$ and $V_{NW}$ by means of the circuit of FIG. 7, it will be noted that the ERASE voltage is applied always to the well 10A first when conducing an erase of information. As a result, the p-n junction formed in the substrate of FIG. 4 is always biased in the reverse biased state, and the turning-on of the parasitic bipolar transistors associated with the wells 10A and 10B is effectively suppressed.

Figure 9:
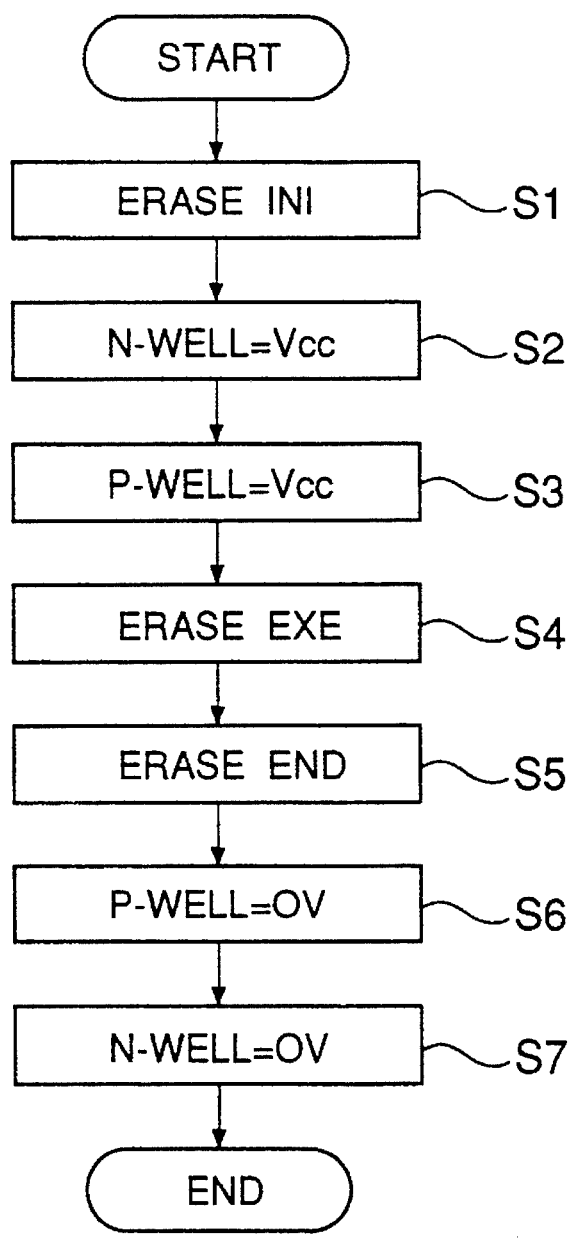
FIG. 9 is a flowchart showing the erasing mode operation of the flash memory of the first embodiment of the present invention.

FIG. 9 is a flowchart of the sequence for applying the ERASE voltage to the substrate 10 of FIG. 4 as a result of use of the circuit of FIG. 7.

Referring to FIG. 9, the erase voltage signal ERASE is produced at imitation ("INI") of the erase mode operation by the erase power supply circuit 29 in a step S1. Further, in a step S2, the NAND gate 114 produces the erase signal $V_{NW}$ in response to the foregoing erase voltage signal ERASE, and the n-type well 10A in the substrate 10 is biased to the level Vcc for the positive supply voltage. Next, in a step S3, the NOR gate 113 produces the erase signal $V_{PW}$ after a delay τ, and the p-type well 10B in the substrate 10 is biased to the foregoing positive Vcc level. Further, erase of information is conducted, or executed ("EXE") in this state in a step S4, wherein the electric charges in the floating gate 12 are dissipated to the substrate 10, more particularly to the p-type well 10B in the substrate 10 after passing through the tunneling insulation film provided under the gate electrode 12. Further, in a step S5, the erase voltage signal ERASE falls, and in response thereto, the erase signal $V_{PW}$ from the NOR gate 113 is canceled in a step S6. Further, in a step S7, the erase signal $V_{NW}$ from the NAND gate 114 is canceled after a delay τ from the moment at which the erase signal $V_{PM}$ is canceled.

Next, a second embodiment of the present invention will be described with reference to FIG. 10, wherein the circuit of FIG. 10 corresponds in part to the circuit of FIG. 5 described with reference to the background art. Thus, a description of those corresponding parts in FIG. 10, designated by the same reference numerals as in FIG. 5 will be omitted.

Figure 3:
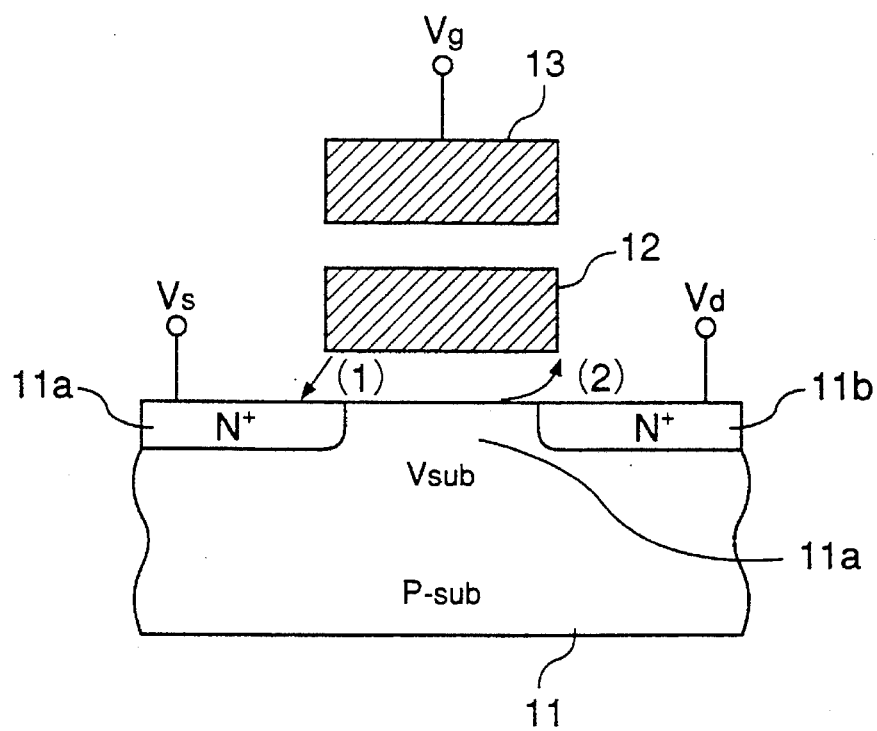
FIGS. 3(A) and 3(B) are diagrams for showing the construction and operation of a conventional flash memory that dissipates electric charges to a source region when erasing information.
Figure 10:
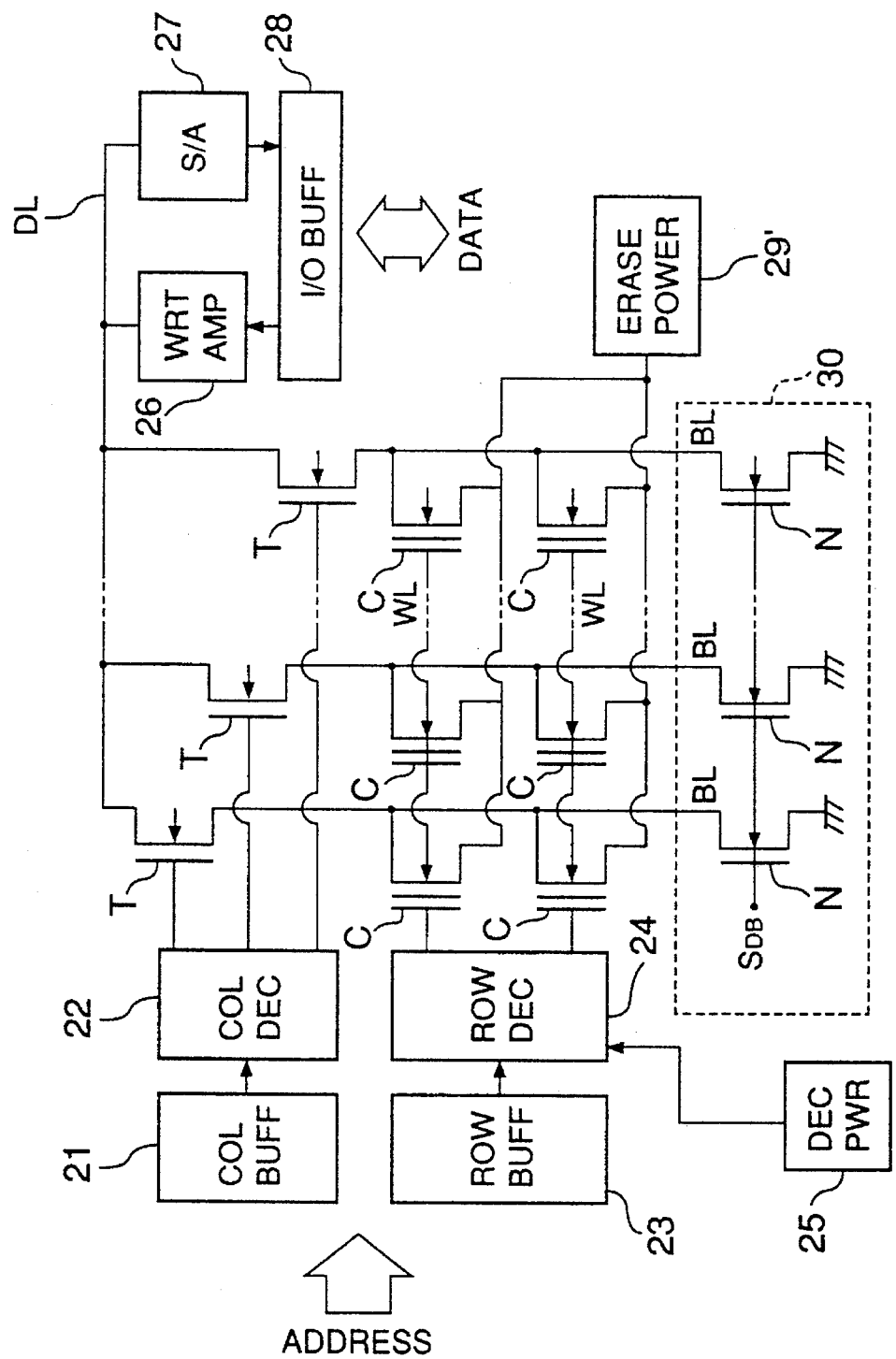
FIG. 10 is a circuit diagram showing the construction of the flash memory according to a second embodiment of the present invention.

Referring to FIG. 10, the flash memory of the present embodiment corresponds to the device shown in FIGS. 3(A) and 3(B) that dissipates the electric charges from the floating gate to the source region of the memory cell when erasing information. Thus, the device of FIG. 10 uses the erase power supply 29' that is connected commonly to the source regions of the memory cells.

Figure 2:
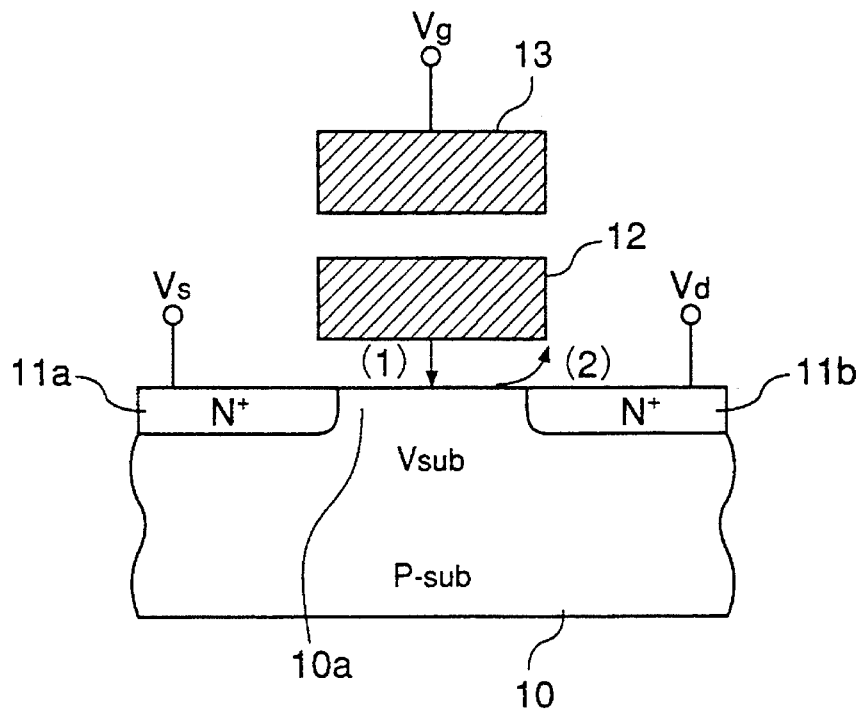
FIGS. 2(A) and 2(B) are diagrams for showing the construction and operation of a conventional flash memory that dissipates electric charges to a substrate when erasing information.

Similarly to usual semiconductor memory devices, the flash memory of FIG. 10 includes the memory cells arranged in rows and columns on a semiconductor substrate, wherein those memory cells aligned in the row direction have respective control electrodes 13 (see, e.g., FIG. 2A) connected commonly to a word line WL. Similarly, those memory cells aligned in the column direction have respective drain regions connected commonly to a bit line BL. The word line WL is selected by the row decoder 24 based upon the address data supplied to the row address buffer 23, while the bit lines BL are selected by the column decoder 22 via the respective switch transistors T, based upon the address data supplied to the column address buffer 21. Further, each of the switch transistors T is connected to the write amplifier 26 and to the sense amplifier 27 via the common data line DL. Further, the write amplifier 26 and the sense amplifier 27 are connected to the data input/output buffer 28.

Figure 11:
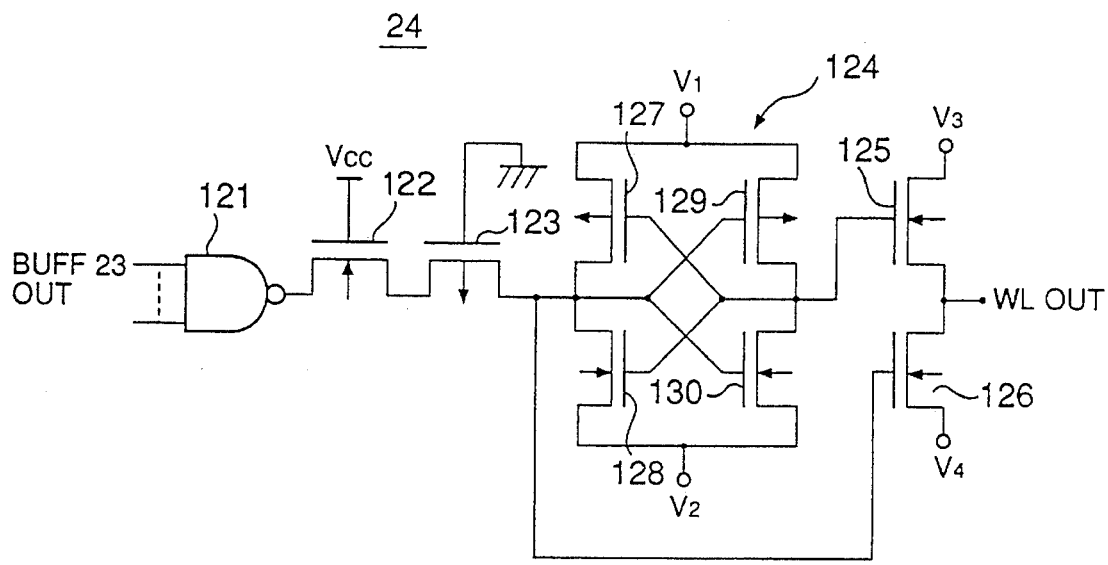
FIGS. 11(A) and 11(B) are diagrams showing the construction and operation of the word decoder used in the circuit of each of FIG. 5 and FIG. 10.

FIG. 11(A) shows the construction of the row decoder 24 in the circuit of FIG. 10.

Referring to FIG. 10, the row decoder 21 includes a NAND gate 121 that is supplied with row address data from the address buffer 23, wherein the NAND gate 121 supplies the output thereof to a latch circuit 124 via an N-channel MOS transistor 122 and a P-channel MOS transistor 123 that are held in the conduction state by the supply voltage Vcc and the substrate voltage $V_{SUB}$. It will be noted that the latch circuit 124 includes a first inverter formed of a P-channel MOS transistor 127 and an N-channel MOS transistor 128 connected in series between a voltage source that supplies a first voltage $V_1$ and a voltage source that supplies a second voltage $V_2$, and a second inverter formed of a P-channel MOS transistor 129 and an N-channel MOS transistor 130 connected in series between the voltage source that supplies the voltage $V_1$ and the other voltage source that supplies the voltage $V_2$, wherein the node, at which the transistors 127 and 128 are connected to each other, is connected to respective gates of the transistors 129 and 130. Thus, the output signal of the MOS transistor 123 is supplied to the node where the transistors 127 and 128 are connected commonly, as an input signal of the latch circuit 124. Similarly, the node at which the transistors 129 and 130 are connected each other, is connected to respective gates of the transistors 127 and 128. Thus, the latch circuit 124 produces an output signal at the node where the transistors 129 and 130 are connected each other. The output signal of the latch circuit 124 thus obtained is supplied to an output circuit formed of N-channel MOS transistors 125 and 126 connected in series between a voltage source that supplies a voltage $V_3$ and another voltage source that supplies a voltage $V_4$. More specifically, the output signal of the foregoing latch circuit 124 is supplied to the gate of the transistor 125 while the input signal to the latch circuit 124 is supplied to the gate of the transistor 126. The output circuit produces the output signal WL OUT at the node where the transistors 124 and 125 are connected commonly, wherein the output signal thus obtained is supplied to the word line WL.

FIG. 11(B) shows the combination of the voltages $V_1$, $V_2$, $V_3$ and $V_4$ used in the circuit of FIG. 11(A) for each of the erasing, writing and reading modes.

Referring to FIG. 11(B), it will be noted that, in the erase mode, the voltage $V_1$ is set to the supply voltage level Vcc and the voltage $V_2$ is set to a negative voltage. As a result, the output of the latch circuit 124, corresponding to the word line selected by the row address data, is held at the level Vcc that corresponds to the voltage $V_1$, in correspondence to the fact that the output of the NAND gate 121 is held in the low level state. As a result, the transistor 125 is turned on and the transistor 126 is turned off. Thus, a large negative voltage is applied to the word line WL. On the other hand, the respective output voltages of the latch circuits 124 corresponding to the word lines not selected by the row address data are held at a negative voltage $V_2$ in correspondence to the high level state of the output of the NAND gate 121. As a result, the transistor 125 of the output circuit in each such latch circuit does not turn on wince the transistor 126 is turned on. Thus, the unselected word lines WL are applied with an anti-disturb voltage with the magnitude of Vcc.

In the write mode, on the other hand, the voltage $V_1$ is set positive while the voltage $V_2$ is set to the ground level. Thus, the latch circuit corresponding to the selected word line produces a positive voltage, and the transistor 125 of the output circuit turns on in response thereto. On the other hand, the transistor 126 does not turn on because of the low level output of the NAND gate 121. As a result, the voltage $V_3$, set to a large positive voltage, is applied to the selected word line WL as a write voltage. On the other hand, the latch circuits 124 corresponding to the unselected word lines supply the voltage $V_2$, set to the ground voltage level, to the transistor 125 as an output signal, in correspondence to the high level state of the output of the NAND gate 121. Thus, the transistor 125 does not turn on. On the other hand, the transistor 126 is turned on by the high level output of the NAND gate 121, and the unselected word line is set to 0 V, corresponding to the ground level.

In the read mode, the voltage $V_1$ is set to the supply voltage level Vcc. Further, the voltage $V_2$ is set to 0 V corresponding to the ground level. Thus, the latch circuit 124, corresponding to the selected word line, supplies the output voltage $V_1$ set to the supply voltage level Vcc, to the output transistor 125 and the transistor 125 is turned on in response thereto. Further, the output transistor 126 turns off in response to the low level voltage signal supplied from the NAND gate 121. As a result, a voltage $V_3$, set to the supply voltage Vcc, is supplied to the selected word line as a read control voltage. On the other hand, the output voltage of the latch circuits corresponding to the unselected word lines is set to the level $V_2$ which is equal to the ground level. Thus, the output transistor 125 is turned off. On the other hand, the output transistor 126 is turned on in response to the output of the NAND gate 121 and the voltage $V_4$, set to zero or ground voltage level is supplied to the word line as the read control voltage.

It should be noted that the circuit of FIG. 10 includes a discharge transistor N in correspondence to each of the bit lines BL for discharging, in the erase mode, the electric charges accumulated on the bit line BL. Each of the transistors N is supplied with a common drive signal $S_{DB}$ and turns on in response to the drive signal $S_{DB}$. As a result of the turning-on of each transistor N, the corresponding bit line BL is grounded. As a result, the problem of erroneous writing into a memory cell in the read mode, conducted subsequently to the erase mode, by the electric charges accumulated on the bit line is successfully eliminated.

Figure 12:
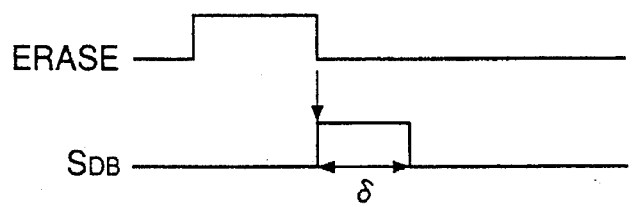
FIG. 12 is a diagram showing the timing for discharging the bit line in the circuit of FIG. 10.

In the present invention, the drive signal $S_{DB}$ of the discharge transistor, N is supplied with a timing shown in FIG. 12, in order to achieve the activation of the discharge transistor N immediately after the end of the erase mode. Referring to FIG. 12, the signal $S_{DB}$ is produced substantially in correspondence to the trailing edge of the ERASE signal and is held in the high level state for an interval corresponding to the time constant of the bit line BL.

Figure 13:
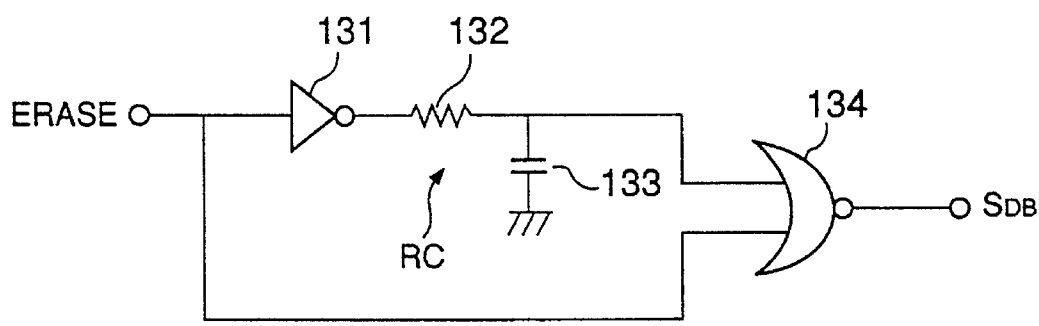
FIG. 13 is a circuit diagram showing the construction for obtaining the timing shown in FIG. 12.

FIG. 13 shows a timing circuit for producing the signal $S_{DB}$ with the timing shown in FIG. 12, wherein the timing circuit includes an inverter 131 supplied with the erase voltage signal ERASE, a time constant circuit RC, formed of a resistor 132 and a capacitor 133 for integrating the output of the inverter 131, and a NOR gate 134 supplied with the output of the time constant circuit RC and the erase voltage signal ERASE. Thus, the NOR gate 134 produces the high level drive signal with the timing shown in FIG. 12 and having an interval, or duration, corresponding to the delay time δ of the time constant circuit RC. It is preferred to set the delay time δ approximately equal to the time constant of the bit line BL.

Figure 14:
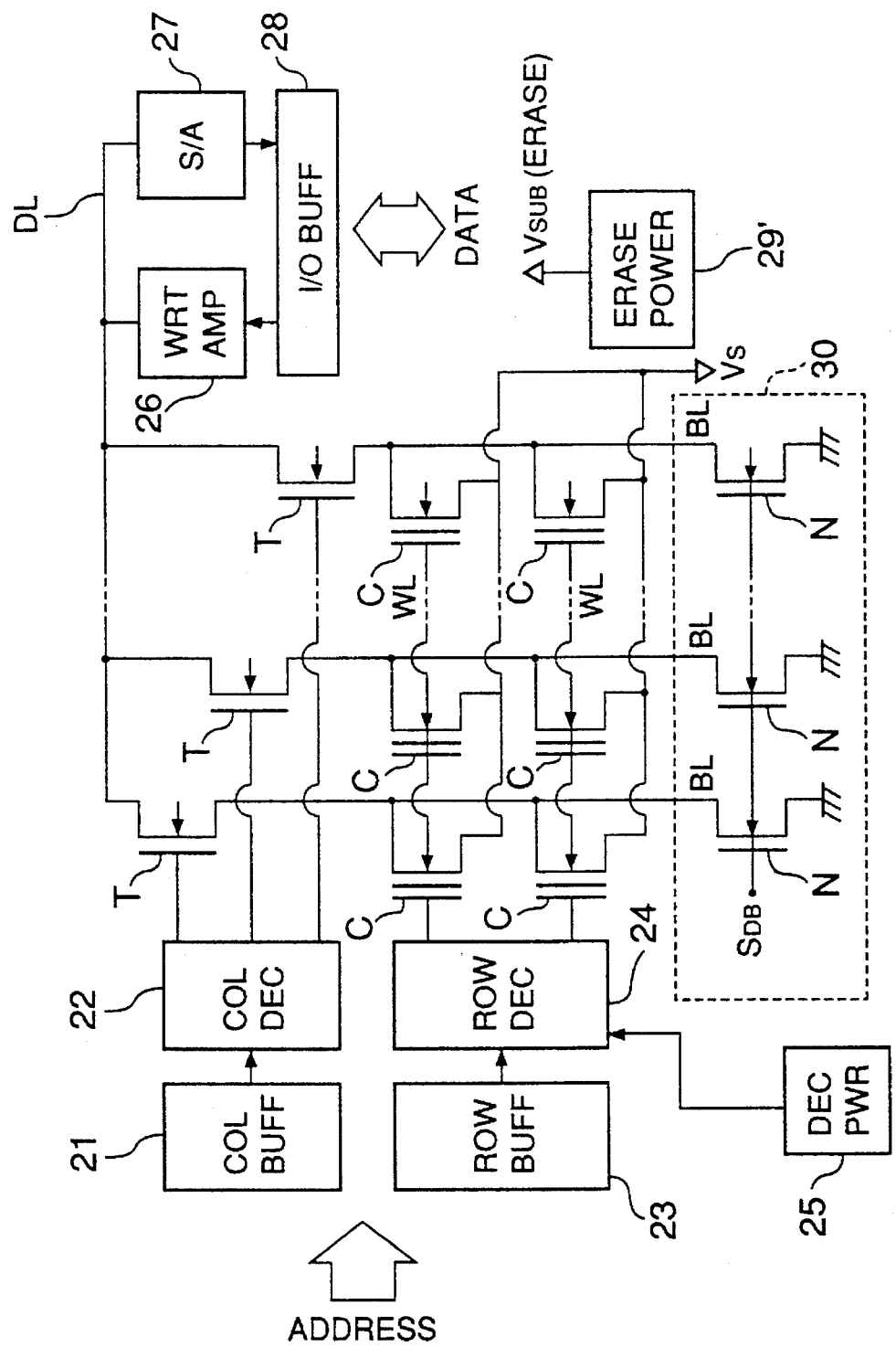
FIG. 14 is a circuit diagram showing an example a construction for discharging the bit line in the flash memory of FIG. 5.

The row decoder of FIG. 11(A) is used also in the flash memory of FIG. 4 that causes the electric charges in the floating gate 12 to dissipate into the channel region in the substrate 10. In the flash memory having such a construction, the bit line BL likewise experiences a charge up in the erase mode, and it is effective to conduct the discharge of the bit line BL by the discharge circuit 30 of FIG. 10. FIG. 14 shows such a construction. As the construction of FIG. 14 is obvious from the foregoing explanations, further description thereof will be omitted.

It should be noted that the flash memory having the circuitry of FIG. 10 eliminates the unwanted erasing of information in the unselected memory cells by applying, in the row decoder 24 of FIG. 11(A), the anti-disturb voltage to the unselected word lines in the erase mode. More specifically, the level of the voltage $V_4$ is set, in correspondence to the erase voltage signal, to the supply voltage level Vcc as indicated in FIG. 11(B). In order to avoid unwanted erase of information in the transient state immediately after the commencement of the erase mode, it is desired to apply the anti-disturb voltage to the control electrode of the corresponding memory cells before the erase voltage is actually applied to the source region of the memory cells. Further, it is desired to cancel the anti-disturb voltage after the erase voltage is canceled.

Figure 15:
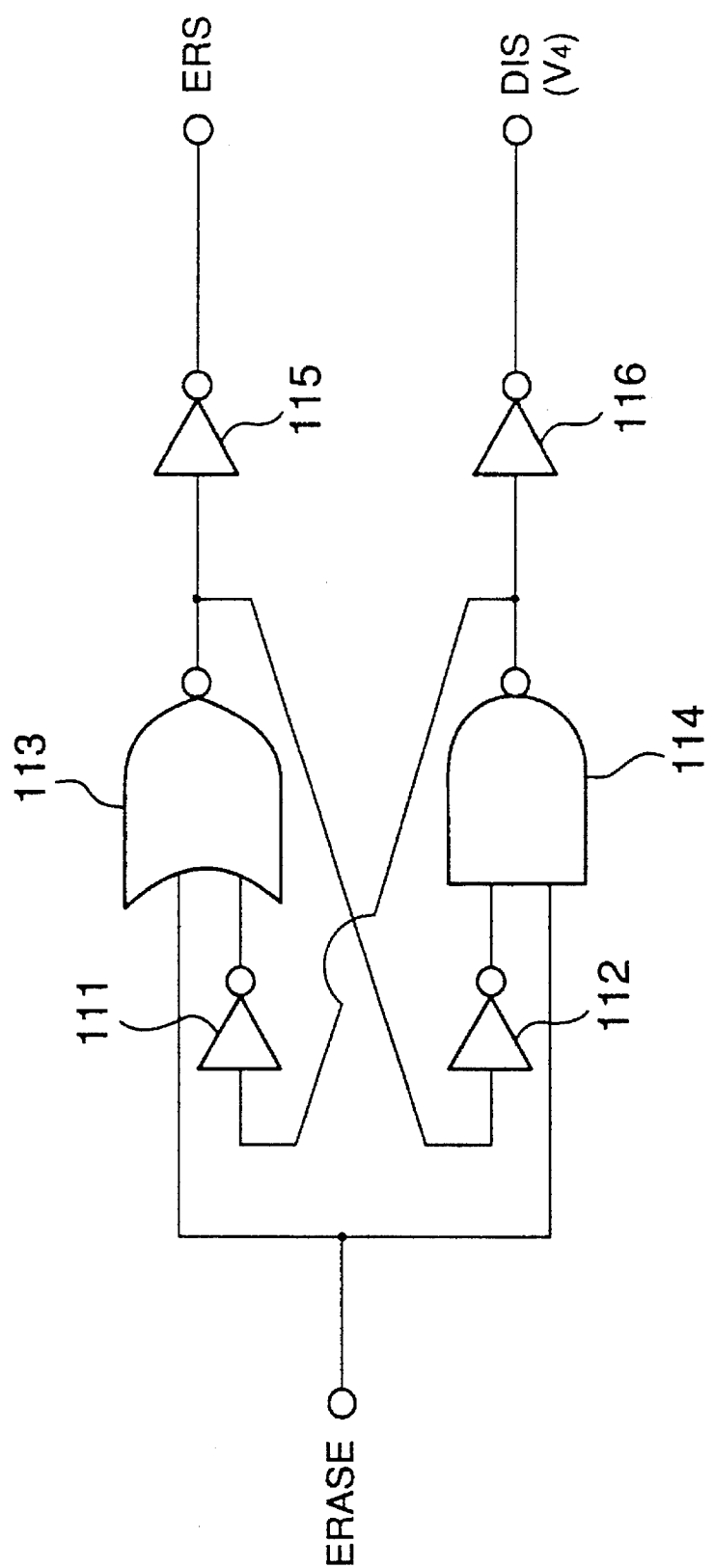
FIG. 15 is a circuit diagram showing the construction of the circuit that is used in the circuit each of FIG. 6 and FIG. 10 for setting the timing of the anti-disturb voltage with respect to the erase voltage.

FIG. 15 shows the construction of a timing circuit for setting the timing of the anti-disturb voltage with respect to the erase voltage signal ERASE.

Referring to FIG. 15, the timing circuit has a construction identical to the construction of the timing circuit shown in FIG. 7. Thus, a description of the construction of the timing circuit of FIG. 15 will be omitted. In the circuit of FIG. 15, the erase voltage signal ERASE is supplied with a timing shown in FIG. 8(A), and an anti-disturb signal DIS is formed in response thereto with a timing shown in FIG. 8(B). Further, an erase voltage signal ERS supplied to the source region of the memory cell is produced with a timing shown in FIG. 8(B). As a result, the voltage $V_4$ corresponding to the anti-disturb voltage DIS is supplied to the row decoder 24 of FIG. 11(A), in advance of the erase voltage signal ERS.

Figure 16:
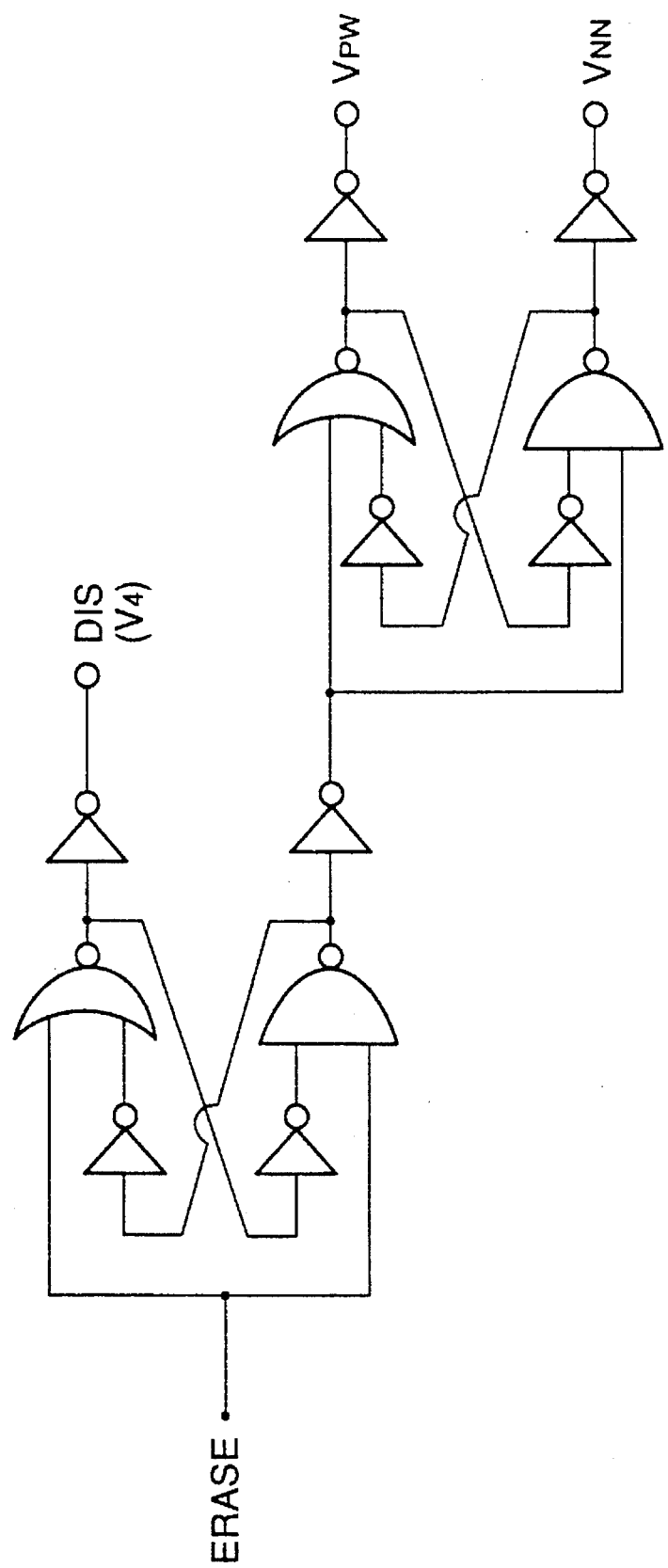
FIG. 16 is a circuit diagram showing the construction of the circuit that is used in the circuit of FIG. 5 for setting the timing of the anti-disturb voltage with respect to the erase voltage.

FIG. 16 shows the construction of the timing circuit for implementing the timing adjustment, described with reference to FIG. 15, to the flash memory having the construction of FIG. 4 or FIG. 14.

Referring to FIG. 16, the illustrated circuit has a construction in which the circuit of FIG. 7 is connected to the timing circuit of FIG. 15 such that the circuit of FIG. 7 is connected to the output terminal of FIG. 15 that supplies the signal ERASE. Thus, the anti-disturb signal DIS and the erase voltage signal $V_{MW}$, to be applied to the well 10A, cause a transition first in response to the transition of the erase voltage signal ERASE. Next, the signal $V_{PW}$, to be applied to the well 10B, causes a transition. As a result, the erase voltage is applied to the substrate without causing conduction of the parasitic bipolar transistor in the substrate 10. It should be noted that the anti-disturb voltage is applied to the control electrode 13 before the erase voltage is applied to the p-type well in the substrate 10.

Figure 17:
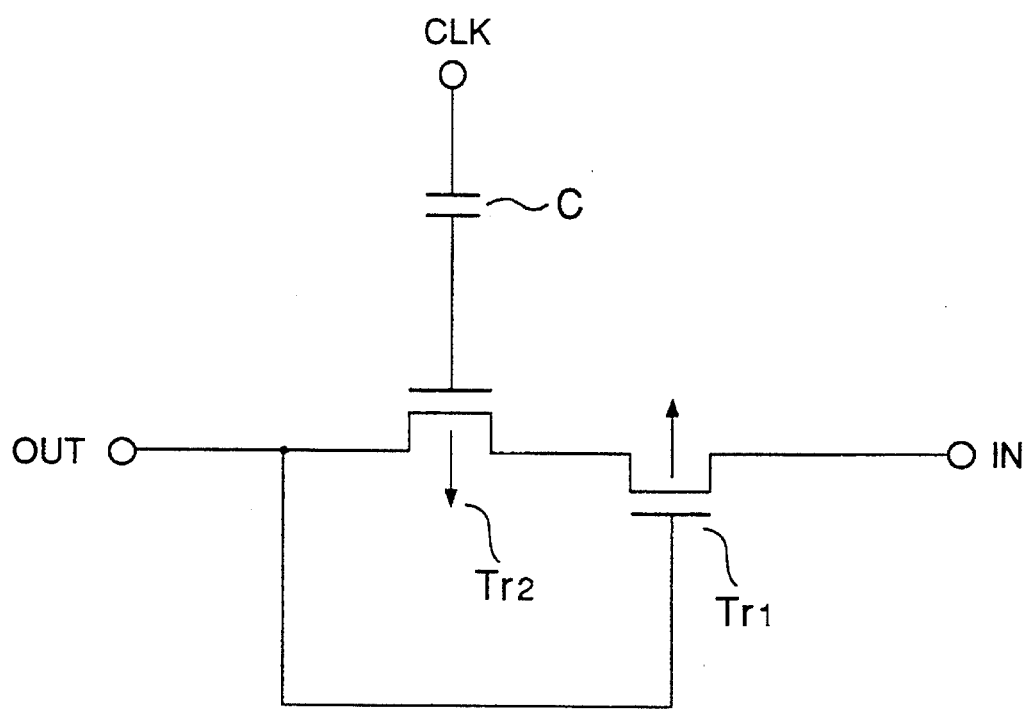
FIG. 17 is a circuit diagram showing a construction for gradually increasing the control voltage applied to the control electrode of the flash memory.

FIG. 17 shows a circuit used in the circuit of FIG. 11(A) for producing the erase voltage $V_3$ such that the concentration of electric field to the tunneling insulation film 12a is relaxed.

Referring to FIG. 17, a large negative voltage corresponding to the voltage $V_3$ is supplied to an input terminal IN, and the negative voltage is supplied to the output terminal OUT and therefrom to the power supply terminal of the circuit of FIG. 11(A) that receives the voltage $V_3$, via P-channel transistors $Tr_1$ and $Tr_2$. Thus, the transistors $Tr_1$ and $Tr_2$ conduct when the voltage level on the output terminal is lower than the voltage level of the voltage on the input terminal IN. Further, the transistor $Tr_2$ receives, at a gate thereof, positive clock pulses continuously via a capacitor C. As a result, the negative charges accumulated in the capacitor C as a result of the foregoing negative input voltage are periodically neutralized, and the rate of increase of the voltage on the output terminal OUT is reduced. Such a decrease in the rate of voltage rise, in turn, relaxes the concentration of the electric field to the tunneling insulation film, and the number of times the flash memory can be updated is increased. The circuit of FIG. 17 is applicable to both the flash memory of FIG. 10 and the flash memory of FIG. 14.

Further, the present invention is by no means limited to those embodiments described heretofore, but various variations and modifications may be made without departing from the scope of the invention.

According to the first aspect of the present invention, one can eliminate the problem of the parasitic bipolar transistor in the substrate being turned on when erasing information from the flash memory. According to the second aspect of the present invention, the problem of erroneous writing of information to the memory cell is avoided by discharging the bit lines after the completion of the erase mode operation. According to a third aspect of the present invention, it is possible to retain information not to be erased, by applying the anti-disturb voltage to those memory cells that hold the information to be retained, in advance of application of the erase voltage and by canceling the anti-disturb voltage, after the erase voltage is canceled. Further, according to a fourth aspect of the present invention, it becomes possible to extend the lifetime of the flash memory by gradually increasing the voltage applied to the control electrode of the memory cell in the erase mode for avoiding the concentration of electric field to the tunneling insulation film.

I claim:

1. A non-volatile semiconductor memory device, comprising:

a semiconductor substrate of a first conductivity type;

a first well of a second, opposite conductivity type formed in a surface portion of said semiconductor substrate such that said first well is included in said semiconductor substrate;

a second well of said first conductivity type formed in a surface portion of said first well such that said second well is included in said first well;

a plurality of memory cells provided in said second well, each of said memory cells comprising a tunneling insulation film provided on a surface of said second well in correspondence to a channel region and having a thickness which allows tunneling of carriers therethrough, a floating gate electrode provided on said tunneling insulation film and insulated electrically thereby from the substrate, an interlayer insulation film provided on said floating gate electrode, a control electrode provided on said interlayer insulation film, and a pair of diffusion regions of said first conductivity type formed in said second well at both sides of said channel region; and erasing means for dissipating electric charges, held in said floating gate electrode, into said channel region in said second well through said tunneling insulation film in the form of a tunneling current and for applying, in response to a start signal indicative of commencement of erasing, a first erase signal to said first well and a second erase signal having a polarity identical to said first erase signal to said second well, said first erase signal being applied in advance of said second erase signal.

2. A non-volatile semiconductor memory device as claimed in claim 1, wherein said erase means cancels said first erase signal after canceling said second erase signal in response to an end signal indicating the end of an erasing mode operation.

3. A non-volatile semiconductor memory device, comprising:

a semiconductor substrate;

a plurality of memory cells arranged in plural rows and plural columns and formed on said semiconductor substrate, each of said plurality of memory cells comprising a tunneling insulation film corresponding to a channel region and having a thickness which allows tunneling of carriers therethrough, a floating gate electrode provided on said tunneling insulation film and insulated electrically thereby from the substrate, an interlayer insulation film provided on said floating gate electrode, a control electrode provided on said interlayer insulation film, a source region formed in said semiconductor substrate in correspondence to a first side of said channel region, and a drain region formed in said semiconductor substrate in correspondence to a second, opposite side of said channel region;

erasing means for erasing information by applying an erase control voltage to said source region of said memory cell such that electric charges, held in said floating gate, are released to said source region through said tunneling insulation film in the form of a tunneling current;

plural bit lines respectively associated with said plural columns of memory cells, the plurality of memory cells included in a common column having respective drain regions connected to a respective, common bit line; and a discharging circuit for discharging electric charges accumulated on each of said bit lines, said discharging circuit being activated in response to completion of erasing of said information stored in said memory cell by said erasing means and causing a discharge of said plurality of bit lines substantially simultaneously.

4. A non-volatile semiconductor memory device as claimed in claim 3, wherein said discharging circuit comprises:

plural discharge transistors respectively connected to the plural bit lines, each discharge transistor being connected between said corresponding bit line and a ground level; and a control circuit supplied with, and responsive to a trailing edge of, said erase control voltage for causing said plural discharge transistors to turn on for an interval corresponding to a time constant of said bit line.

5. A non-volatile semiconductor memory device, comprising:

a semiconductor substrate;

a plurality of memory cells formed on said semiconductor substrate, each of said plurality of memory cells comprising a tunneling insulation film provided in correspondence to a channel region and having a thickness allowing tunneling of carriers therethrough, a floating gate electrode provided on said tunneling insulation film and insulated electrically thereby from the substrate, an interlayer insulation film provided on said floating gate electrode, a control electrode provided on said interlayer insulation film, a source region formed in said semiconductor substrate in a first side of said channel region, and a drain region formed in said semiconductor substrate in a second, opposite side of said channel region;

erasing means for erasing information by applying an erase control voltage to said substrate such that electric charges held in said floating gate are released to a channel region in said substrate through said tunneling insulation film in the form of a tunneling current;

plural bit lines respectively associated with said plural columns of memory cells, the plurality of memory cells included in a common column having respective drain regions connected to a respective, common bit line; and a discharging circuit for discharging electric charges accumulated on each of said bit lines, said discharging circuit being activated in response to completion of erasing of said information stored in said memory cell by said erasing means and causing a discharge of said plurality of bit lines substantially simultaneously.

6. A non-volatile semiconductor memory device as claimed in claim 5, wherein said discharging circuit comprises:

plural discharge transistors respectively connected to the plural bit lies, each discharge transistor being connected between said corresponding bit line and a ground level; and a control circuit supplied with, and responsive to a trailing edge of, said erase control voltage for causing said plural discharge transistors to turn on for an interval corresponding to a time constant of said bit line.

7. A non-volatile semiconductor memory device, comprising:

a semiconductor substrate;

a plurality of memory cells arranged in plural rows and plural columns and formed on said semiconductor substrate, each of said plurality of memory cells comprising a tunneling insulation film corresponding to a channel region and having a thickness which allows tunneling of carriers therethrough, a floating gate electrode provided on said tunneling insulation film and insulated electrically thereby from the substrate, an interlayer insulation film provided on said floating gate electrode, a control electrode provided on said interlayer insulation film, a source region formed in said semiconductor substrate in a first side of said channel region, and a drain region formed in said semiconductor substrate in a second, opposite side of said channel region;

selection means, supplied with an address signal and responsive thereto for selecting a memory cell from said plurality of memory cells;

erasing means for erasing information from the memory cell selected by said selection means in the form of a flow of tunneling current through said tunneling insulation film to said source region, by applying an erase control voltage to said source regions of said memory cells, including both selected and unselected memory cells, said erasing means applying said erase control voltage to said source region of said memory cell, with a polarity and magnitude such that electric charges held in said floating gate as information are extracted, and simultaneously applying an anti-disturb voltage to said control electrode of said memory cells, other than said selected memory cell, for avoiding unnecessary erasing of information therefrom; and said erasing means further comprising timing setting means for canceling said anti-disturb voltage upon completion of erasing of information and subsequently to termination of said erase control voltage.

8. A non-volatile semiconductor memory device as claimed in claim 7, wherein said timing setting means applies said anti-disturb voltage, upon commencement of erasing of information, such that said anti-disturb voltage is applied in advance of said erase control voltage.

9. A non-volatile semiconductor memory device, comprising:

semiconductor substrate;

a plurality of memory cells arranged in plural rows and plural columns and formed on said semiconductor substrate, each of said plurality of memory cells comprising a tunneling insulation film corresponding to a channel region and having a thickness which allows tunneling of carriers therethrough, a floating gate electrode provided on said tunneling insulation film and insulated electrically thereby from the substrate, an interlayer insulation film provided on said floating gate electrode, a control electrode provided on said interlayer insulation film, a source region formed in said semiconductor substrate in a first side of said channel region, and a drain region formed in said semiconductor substrate in a second, opposite side of said channel region;

selection means supplied with an address signal for selecting a memory cell from said plurality of memory cells in response thereto;

erasing means for erasing information from the memory cell selected by said selection means in the form of a flow of tunneling current through said tunneling insulation film to a channel region defined in said semiconductor substrate, by applying an erase control voltage to said channel region in said semiconductor substrate, said erasing means applying said erase control voltage to said channel region in said semiconductor substrate, with a polarity and magnitude such that electric charges held in said floating gate as information are extracted, and simultaneously applying an anti-disturb voltage to said control electrode of said memory cells, other than said selected memory cell, for avoiding unnecessary erasing of information therefrom; and said erasing means further comprising timing setting means for canceling said anti-disturb voltage upon completion of erasing of information and subsequently to termination of said erase control voltage.

10. A non-volatile semiconductor memory device as claimed in claim 9, wherein said timing setting means applies said anti-disturb voltage, upon commencement of erasing of information, such that said anti-disturb voltage is applied in advance of said erase control voltage.

11. A non-volatile semiconductor memory device, comprising:

a semiconductor substrate;

a plurality of memory cells arranged in plural rows and plural columns and formed on said semiconductor substrate, each of said plurality of memory cells comprising a tunneling insulation film corresponding to a channel region and having a thickness which allows tunneling of carriers therethrough, a floating gate electrode provided on said tunneling insulation film and insulated electrically thereby from the substrate, an interlayer insulation film provided on said floating gate electrode, a control electrode provided on said interlayer insulation film, a source region formed in said semiconductor substrate in a first side of said channel region, and a drain region formed in said semiconductor substrate in a second, opposite side of said channel region;

selection means, supplied with an address signal and responsive thereto, for selecting a memory cell from said plurality of memory cells; and erasing means for erasing information from the memory cell selected by said selection means in the form of a flow of tunneling current through said tunneling insulation film to said source region, by applying an erase control voltage to said source regions of said memory cells, including both selected and unselected memory cells, said erasing means further comprising a boost control circuit that supplies a control voltage to said control electrode of said selected memory cell so as to expel electric charges accumulated in said floating gate electrode thereof, said boost control circuit causing a gradual increase of said control voltage.

12. A non-volatile semiconductor memory device as claimed in claim 11, wherein said boost control circuit comprises;

current supplying means, supplied with said control voltage, for supplying electric charges to said floating gate electrode in response thereto; and leak means, supplied with a periodic pulse signal, for removing electric charges periodically from said current supplying means in response to said periodic pulse signal.

13. A non-volatile semiconductor memory device, comprising:

a semiconductor substrate;

a plurality of memory cells formed on said semiconductor substrate, each of said plurality of memory cells comprising a tunneling insulation film provided in correspondence to a channel region and having a thickness allowing tunneling of carriers therethrough, a floating gate electrode provided on said tunneling insulation film and insulated electrically thereby from the substrate, an interlayer insulation film provided on said floating gate electrode, a control electrode provided on said interlayer insulation film, a source region formed in said semiconductor substrate in a first side of said channel region, and a drain region formed in said semiconductor substrate in a second, opposite side of said channel region;

selection means supplied with an address signal for selecting a memory cell from said plurality of memory cells in response thereto; and erasing means for erasing information from the memory cell selected by said selection means by causing a flow of tunneling current through said tunneling insulation film to a channel region defined in said substrate, by applying an erase control voltage to said channel region in said substrate, said erasing means further comprising a boost control circuit that supplies a control voltage to said control electrode of said selected memory cell so as to expel electric charges accumulated in said floating gate electrode thereof, said boost control circuit causing a gradual increase of said control voltage.

14. A non-volatile semiconductor memory device as claimed in claim 13, wherein said boost control circuit comprises:

current supplying means, supplied with said control voltage from a voltage source, for supplying electric charges to said floating gate electrode in response thereto; and leak means, supplied with a periodical pulse signal, for removing electric charges periodically from said current supplying means in response to said pulse signal.

* * * * *

UNITED STATES PATENT AND TRADEMARK OFFICE
CERTIFICATE OF CORRECTION

PATENT NO. : 5,521,866
DATED      : May 28, 1996
INVENTOR(S): AKAOGI

It is certified that error appears in the above-indentified patent and that said Letters Patent is hereby corrected as shown below:

Col. 1,  line 23, change "parts such" to --parts, such--.

Col. 9, line 51, delete "caused by the inverter 111, following" and insert --from--.
Col. 9,  line 52, change "T from" to --$\tau$ caused by the inverter 111, following--;
         line 63, change "delay $\tau$" to --delay $\tau$,--.

Figure 5:
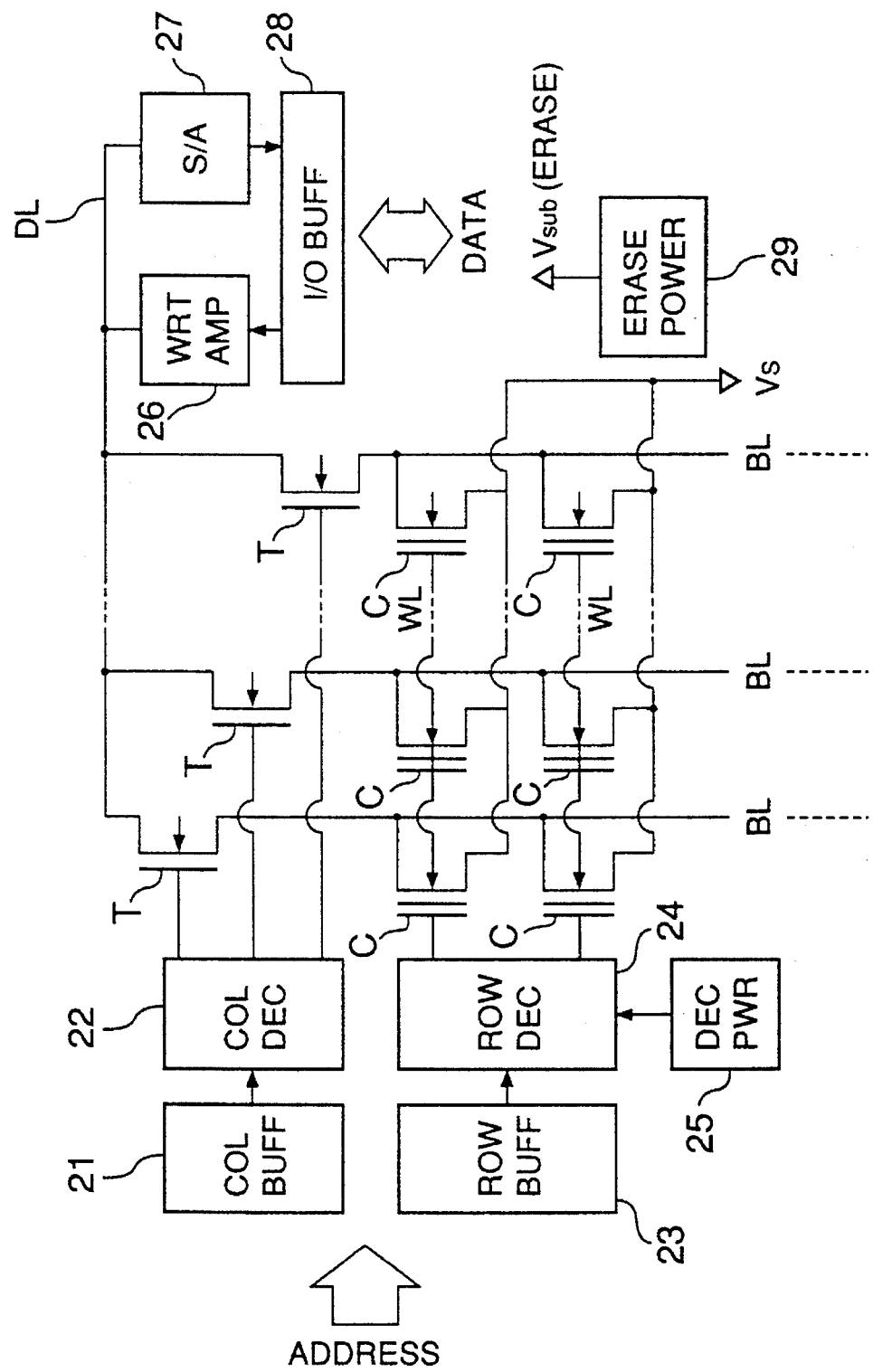
FIG. 5 is a circuit diagram showing the circuitry of the flash memory of FIG. 4.
Figure 6:
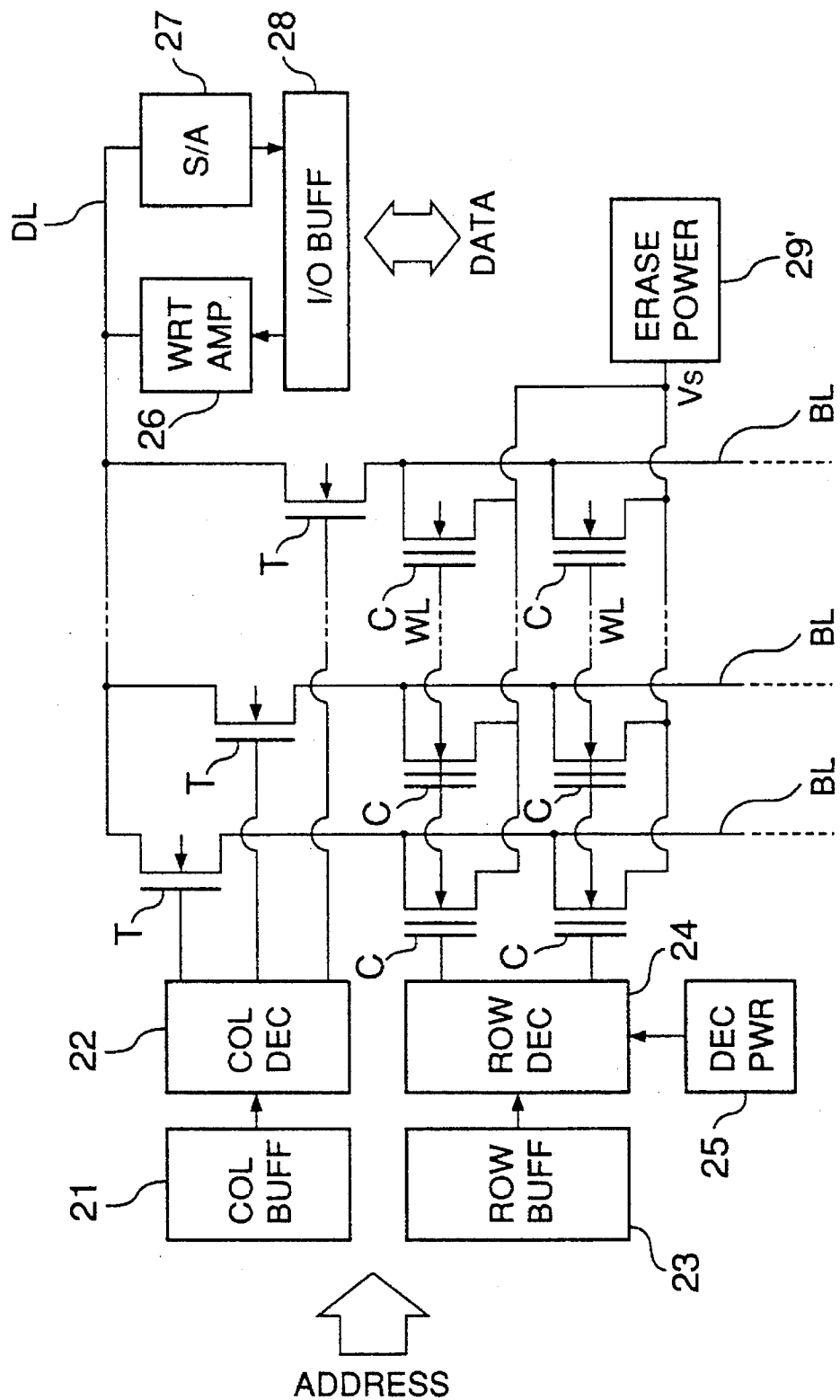
FIG. 6 is a circuit diagram showing the circuitry of the flash memory of FIGS. 3(A) and 3(B)

Col. 10, line 39, after "FIG. 5" insert --,--.

Col. 11, line 56, change "on wince" to --on, since--.

Col. 12, line 13, after "$V_1$" insert --,--;

line 39, change "transistor N" to --transistors N--.

Col. 13, line 28, after "ERS" insert --,--;
         line 29, after "cell" insert --,--.

Col. 18, line 15 (claim 12, line 3), change "comprises;" to --comprises:--.

Signed and Sealed this

Eighth Day of October, 1996

Attest:

BRUCE LEHMAN

Attesting Officer      Commissioner of Patents and Trademarks